(12) United States Patent
Bonifield et al.

(10) Patent No.: US 8,154,134 B2
(45) Date of Patent: Apr. 10, 2012

(54) PACKAGED ELECTRONIC DEVICES WITH FACE-UP DIE HAVING TSV CONNECTION TO LEADS AND DIE PAD

(75) Inventors: Thomas D. Bonifield, Dallas, TX (US); Gary P. Morrison, Garland, TX (US); Rajiv Dunne, Murphy, TX (US); Satyendra S. Chauhan, Sugarland, TX (US); Masood Murtuza, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/463,184

(22) Filed: May 8, 2009

(65) Prior Publication Data

US 2009/0278245 A1 Nov. 12, 2009

Related U.S. Application Data

(60) Provisional application No. 61/052,456, filed on May 12, 2008.

(51) Int. Cl.
*H01L 23/48* (2006.01)
*H01L 23/52* (2006.01)
*H01L 29/40* (2006.01)
*H01L 23/495* (2006.01)
*H01L 23/04* (2006.01)

(52) U.S. Cl. ........ 257/774; 257/676; 257/697; 257/698; 257/E23.011; 257/E23.067

(58) Field of Classification Search .................. 257/676, 257/774, 697, 698, E23.011, E23.067
See application file for complete search history.

(56) References Cited

U.S. PATENT DOCUMENTS

| 5,986,338 | A | 11/1999 | Nakajima | |
|---|---|---|---|---|
| 6,168,969 | B1 * | 1/2001 | Farnworth | 438/106 |
| 6,462,419 | B1 * | 10/2002 | Asai | 257/774 |
| 7,317,256 | B2 | 1/2008 | Williams et al. | |
| 7,829,997 | B2 * | 11/2010 | Hess et al. | 257/691 |
| 2005/0023558 | A1 | 2/2005 | Shi | |
| 2006/0166397 | A1 | 7/2006 | Lau et al. | |
| 2007/0085198 | A1 | 4/2007 | Shi et al. | |
| 2008/0246165 | A1 * | 10/2008 | Hess et al. | 257/784 |
| 2008/0318361 | A1 | 12/2008 | Han et al. | |
| 2009/0115026 | A1 * | 5/2009 | Gerber et al. | 257/621 |
| 2009/0278244 | A1 * | 11/2009 | Dunne et al. | 257/676 |

* cited by examiner

*Primary Examiner* — Minh-Loan T Tran
*Assistant Examiner* — Teresa M Arroyo
(74) *Attorney, Agent, or Firm* — Steven A. Shaw; W. James Brady; Frederick J. Telecky, Jr.

(57) ABSTRACT

A packaged electronic device includes a leadframe including a die pad, a first, second, and third lead pin surrounding the die pad. An IC die is assembled in a face-up configuration on the lead frame. The IC die includes a substrate having an active top surface and a bottom surface, wherein the top surface includes integrated circuitry including an input pad, an output pad, a power supply pad, and a ground pad, and a plurality of through-substrate vias (TSVs) including an electrically conductive filler material and a dielectric liner. The TSVs couple the input pad to the first lead pin, the output pad to the second lead pin, the power supply pad to a third lead pin or a portion of the die pad. A fourth TSV couples pads coupled to the ground node to the die pad or a portion of the die pad for a split die pad.

14 Claims, 4 Drawing Sheets

PACKAGED ELECTRONIC DEVICES WITH FACE-UP DIE HAVING TSV CONNECTION TO LEADS AND DIE PAD

CROSS REFERENCE TO RELATED APPLICATIONS

This application claims the benefit of Provisional Application Ser. No. 61/052,456, filed May 12, 2008, which is herein incorporated by reference in its entirety.

FIELD OF THE INVENTION

Embodiments of the present invention relate to integrated circuit (IC) devices having die including through substrate vias (TSVs) assembled face-up in the package.

BACKGROUND

Reduction in package footprint is becoming increasingly important. As known in the art, leadless packages, such as the quad flatpack no-lead (QFN), provide reduced size and improved performance as compared to leaded packages that have leads which extend out from the side of the package. Conventional assembly utilizes a plurality of wire bonds for electrically coupling the IC die to the metal terminals exposed on the bottom peripheral surface of the package body. As known in the art, during device operation the wire bonds act inductively and can degrade device performance, particularly during high frequency operation.

An alternative solution to eliminate wire bonds is to assemble the IC die upside down as a flip chip. However, the flip chip method is not capable of stacking IC die or other components to the face of the prime die (i.e. the die adjacent to the package substrate (e.g., PCB) inside the package. Moreover, the flip chip arrangement can significantly reduce thermal dissipation paths generally available in certain packages, such as the large area center leadframe die pad generally provided by QFN packages that is exposed for contact at the bottom of the package.

SUMMARY

Embodiments of the present invention include packaged electronic devices including an IC die comprising a plurality of TSVs. The IC die is bonded face up to a lead frame to create interconnects for its I/O, ground, and generally also the power supply pads which are on the active top semiconductor comprising surface of the IC die, which are coupled by the TSVs to the leadframe of the package. The bond wires required for conventional face-up die assembled devices are eliminated by embodiments of the invention, leading to improved device performance, particularly for high frequencies operation. The IC die and leadframe are generally configured so that the TSVs of the IC die are aligned to the die pad and lead pins. However, a redirect metal layer (RDL) may be used on the bottom of the IC die to remove the alignment need.

In embodiments of the invention, unlike flip chip arrangements, the bottom surface of the IC die is bonded to the die pad of the lead frame, which can be a grounded die pad. The presence of grounded TSVs coupled in a low electrical and thermal resistance path to the grounded die pad improves the ground connection (e.g., reduced resistance to ground) and the thermal dissipation compared to the flip chip arrangement.

As used herein, the term "TSV" is defined broadly to include any wafer or IC die having a through via filled with an electrically conductive filler material (e.g., metal such as copper or tungsten or a degeneratively doped semiconductor such as n+ or p+ doped silicon). The substrate can be a silicon comprising substrate, such as a bulk silicon, silicon germanium, or a silicon on insulator (SOI) substrate. The TSV via provides an electrical contact that extends from the bottom of the wafer or IC die and extends to the contact level or any of the metal interconnect levels on the top side wafer or die surface. The TSVs can generally be formed by either via first or a via last processing.

In one embodiment of the invention the package comprises a leadframe comprising a die pad and a plurality of lead pins including a first, second, and third lead pin surrounding the die pad electrically isolated from one another and electrically isolated from the die pad. At least a first IC die is assembled in a face-up configuration on the leadframe. The IC die comprises a substrate having an active top semiconductor comprising surface and a bottom surface, wherein the top semiconductor comprising surface includes integrated circuitry having at least one input pad, at least one output pad, at least one power supply pad, and at least one ground pad. The IC die includes a plurality of TSVs which comprise an electrically conductive filler material and a dielectric liner surrounding the electrically conductive filler material that extends from the top semiconductor comprising surface (e.g., contact or a metal level) to at least the bottom surface, and generally out from the bottom surface a distance referred to herein as a tip height. For a conventional die pad arrangement, the plurality of TSVs generally comprise a first TSV coupling the input pad to the first lead pin, a second TSV coupling the output pad to the second lead pin, a third TSV coupling the power supply pad to the third lead pin, and a fourth TSV coupling the ground pad to the die pad.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Embodiments of the invention describe packaged electronic devices comprising a package comprising a leadframe including a die pad and a first IC die mounted face up on the leadframe. The IC die comprises a plurality of TSVs that comprise electrically conductive filler material that provides interconnections from the I/O, ground and generally the power supply pads on the top side of the IC die (that includes integrated circuitry) through to the bottom side of the die to the leadframe pins and die pad of the package. The TSVs can include protruding integral TSV tips that comprise the electrically conductive filler material that extend a tip length beyond the bottom of the IC die. As used herein, a protruding integral TSV tip comprises an electrically conductive filler material and optional liner that both protrude from the bottom surface of the substrate.

The tip length is generally 1 to 50 µm, and is typically at least 5 microns. The TSVs can also include a liner, typically a dielectric liner where electrically isolation of the TSV is desired. At the end of this detailed description and exemplary method for forming TSVs is described for forming die having dielectric lined TSVs having protruding integral TSV tips that protrude from the bottom side of the die having a dielectric tip liner along a portion of the tip height. However, other processes sequences may also be used with embodiments of the invention.

Throughout this application, the term "leadframe" is defined as that packaging constituent that is mechanically attached to the semiconductor die by either an epoxy material or matrix of solder balls and that facilitates electrically connecting the integrated circuit to another electronic component. Typically leadframes in the industry are made from electrically conductive metals such as copper or Alloy-42 and quite often contain a thin coating of silver, gold or palladium. However, in this application, the term leadframes also refers to organic substrates or interposers commonly used in area array packages. Electronic substrates or interposers consist of an insulating material having electrically conductive paths extending through the interposer from one surface to the opposite surface forming electrical entry and exit paths.

Figure 1A:
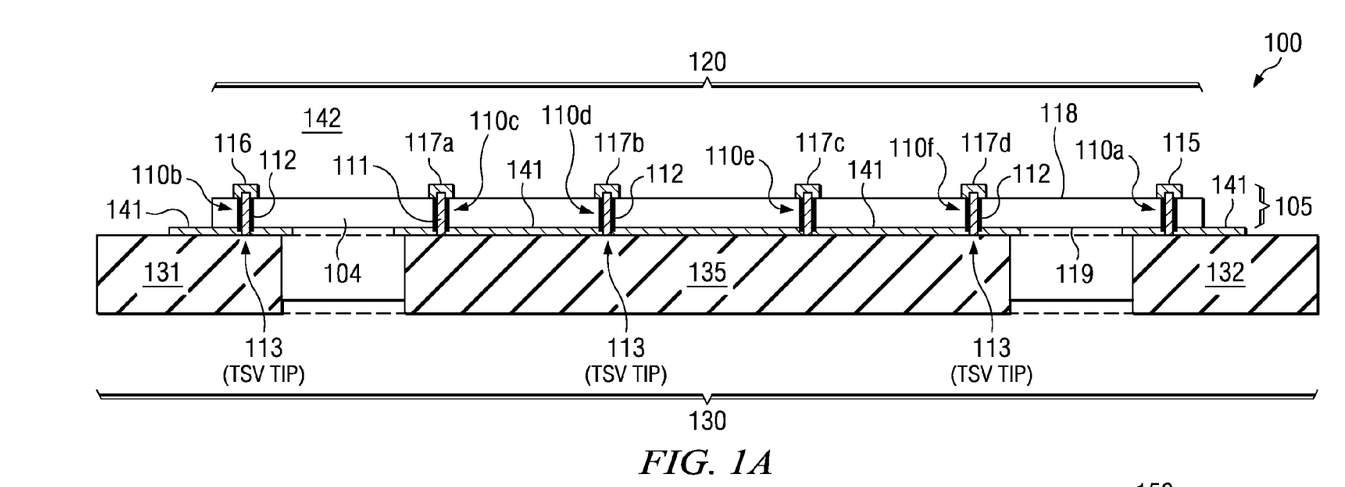
FIG. 1A is cross sectional depiction of a packaged electronic device according to an embodiment of the invention viewed along the center of the package including TSVs that connect pads on the top surface of the IC die to lead pins of the package for I/O connections and to the die pad of the package for ground connections.

FIG. 1A is cross sectional depiction of a packaged electronic device 100 comprising a leadframe 130 of a package and an IC die 105 mounted face up on the leadframe 130 viewed along the center of the package, according to an embodiment of the invention. The IC die 105 comprises a substrate 104 having an active top semiconductor comprising top surface 118 and a bottom surface 119. Pads (from any level of the multi-level metallization or contact level) 115, 116 and 117($a$)-($d$) are coupled to respective nodes of functional circuit 120 which is generally formed in or on top surface 118.

Leadframe 130 includes a plurality of I/O signal lead frame pins including pin 131, power pin 132 and centrally located die pad 135 for mounting and grounding IC die 105. IC die 105 is seen to extend beyond die pad 135 to reach lead frame pins 131 and 132. The plurality of TSVs (collectively TSVs 110) include a first TSV 110($a$) that couples a pad 115 (e.g., VDD pad) of the IC die 105 to lead pin 132, a second TSV 110($b$) that couples another pad 116 (e.g., an input or output pad) to lead pin 131, and TSVs 110($c$)-($f$) that each couple other pads 117($a$)-($d$) to mount and ground die pad 135 for ground connections for IC die 105.

The TSVs 110 comprise an electrically conductive filler material (e.g., Cu) center portion 111 and an outer dielectric liner 112 for electrically insulating the electrically conductive filler material 111 from substrate 104 and extends from the top semiconductor comprising surface 118 (e.g., contact or metal level) to at least the bottom surface 119 with exposed protruding integral TSV tips 113 shown on the backside of the IC die 105 for connecting to the leadframe 130. The dielectric liner 112 is seen extending onto sidewalls of the protruding integral TSV tips 113 a distance of at least 1% f the tip height. The protruding integral TSV tips 113 generally have a tip height from 5 to 50 microns as measured from bottom surface 119 of substrate 104.

Electrically conductive die attach adhesive or solder regions 141 are shown lateral to the TSVs 110 and positioned between the bottom surface 119 of IC die 105 and the die pad 135 and lead pins of leadframe 130 for improving the electrical and physical connection between TSVs 110 and leadframe 130. In one embodiment, an electrically conductive die attach material (e.g., Ag filled epoxy), either using a conductive adhesive material or a solder comprising material, is placed on the die pad 135 and leads 131, 132 of the leadframe 130, such as for a QFN package. This is different as compared to a conventional QFN package which uses the die attach adhesive only on part of the die pad. Alternatively, as described below, the TSV tips 110 can have a solder comprising cap so that the leadframe does not need solder. In this embodiment, mold compound 142 shown can also act as an underfill to further adhere the IC die 105 to leadframe 130. This material class is generally referred to as molded underfills.

At least a portion of I/O leads 131 and 132 of leadframe 130 can be seen to extend under the IC die 105. The IC die 105 and the leadframe 130 can be co-designed to place the TSVs 110 on the IC die 105 in a position that aligns to the leadframe pins 131, 132. Alternatively, as described below relative to FIG. 4, the IC die can include an RDL built using a BEOL wafer level process prior to assembly to avoid the need to co-design the TSVs 110 of the IC and the leadframe 130 so that the locations of the TSVs 110 are all aligned to of pins of the leadframe 130.

Although not shown, the leadframe 130 can include dimples in its top surface at the locations of the TSVs 110 to assist in proper placement and mechanical stability. Moreover, the leadframe 130 may have a finish which is compatible with the finish on the tips of the TSVs to assist in forming a strong, reliable joint between the TSV tips 113 and the leadframe 130. For example, the leadframe could have a solder finish and the TSV tips 113 could be bare copper which is well known to bond to solder. Alternatively, in one specific embodiment, the TSV tips 113 and the leadframe 130 could both have a Ni/Pd/Au finish which would bond well together.

In one embodiment, the package comprises a leadless package, such as a QFN, leadless QFP, leadless SOIC, or leadless TSOP. In the QFN embodiment, the leadframe and package design can place the IC die partially overlapping onto the lead pins of the leadframe but still keeps most of the die area touching the grounded die mount pad. For the QFN, as known in the art, the die mount pad is also exposed on the bottom of the package for solder attaching to the printed circuit board as is usual with a QFN package for obtaining good thermal heat dissipation. In another embodiment, the package comprises a leaded package, such as a SOIC, leaded QFP, or leaded TSOP.

Figure 1B:
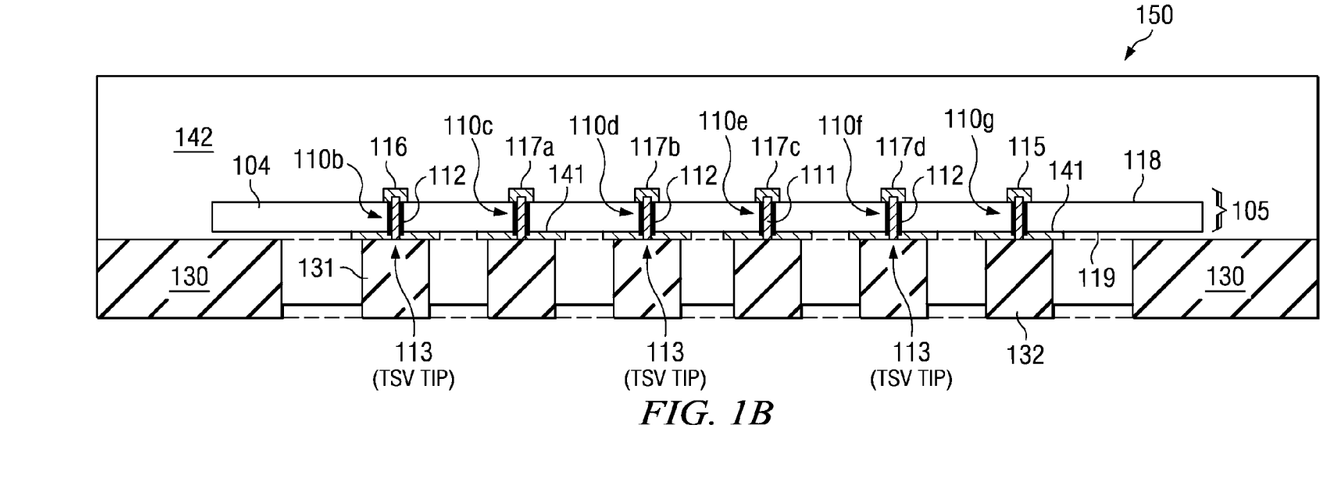
FIG. 1B is cross sectional depiction of a packaged electronic device according to an embodiment of the invention viewed along one edge of the package along the center of the package including TSVs that connect pads on the top surface of the IC die to lead pins of the package for I/O connections and to the die pad of the package for ground connections.

FIG. 1B is cross sectional depiction 150 of the packaged electronic device 100 shown in FIG. 1A of the invention viewed along one edge of the package comprising leadframe 130 along the center of the package. TSVs 110 are shown connecting pads 115, 116 on the top surface of the IC die 105 to lead pins 132, 131 of the package for P and I/O connections, respectively. TSV connections to the die pad for grounding being in the center of the leadframe 130 are not shown in the edge view provided in FIG. 1B.

Figure 1C:
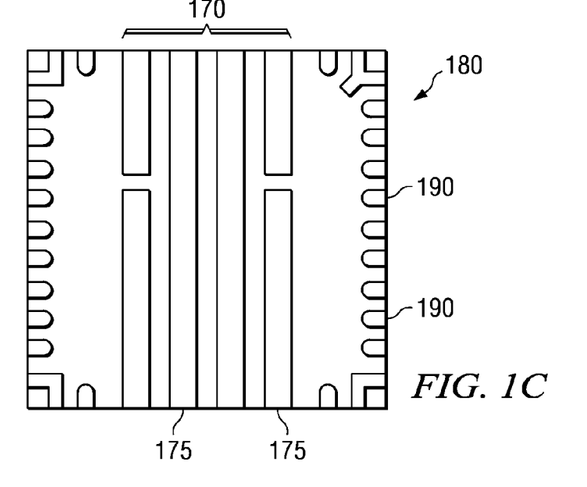
FIG. 1C shows an exemplary leadframe according to an embodiment of the invention for face up mounting a TSV comprising IC die, where the TSVs provide signal I/O, power (P) and ground (G) electrically connecting I/O, P, and G nodes on the top side of IC die (not shown) to lead frame pads/pins for the I/O, P, and G, according to an embodiment of the invention.

FIG. 1C shows an exemplary leadframe 180 according to an embodiment of the invention for face up mounting a TSV comprising IC die, where the TSVs provide I/O, P and G electrically connecting I/O, P, and G nodes on the top-side of IC die (not shown) to lead frame pads/pins for signal I/O, P, and G. Leadframe 180 includes a split die pad 170 having a plurality of relatively large power (P) and ground (G) strips 175 to enable high power/current density applications, and a plurality of smaller periphery pads 190 for signal I/O connections. P and G strips 175 are large enough in area (generally being at least 10× (e.g., >50×) the area of the smaller periphery pads 190) to accommodate a plurality of TSVs. For example, if all P TSV-pins and G TSV-pins of an IC are grouped/clumped together, such as coupled together by a back-side RDL, they can all connect to larger die pad areas provided by P and G strips, which will improve package thermal performance, which can be especially useful for high power packages.

A significant advantage obtained using TSV comprising ICs in face-up configuration according to embodiments of the invention is that there is no longer a need to use up die space in BEOL (metal) layers of the IC for the large rectangular P/G pads needed for use in the standard face-down FC-QFN packages, since the TSVs allocated for the P/G connections will generally be much smaller and thus use up less die space. Although not shown, the IC will generally include TSVs that generally align to the P and G strips 175 and the periphery pads 190, although an RDL layer on the backside of the IC can relax the alignment need. As known in the art, these strips extend to the package edge as separate lead pins that get soldered to a package substrate, such as a customer's PCB to couple common connections.

Figure 1D:
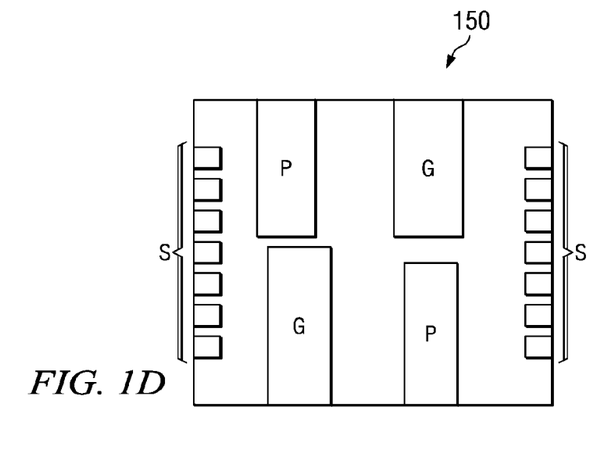
FIGS. 1D and 1E each show split die pad leadframe designs that can be used with TSV comprising ICs to form packaged electronic devices, according to embodiments of the invention.
Figure 1E:
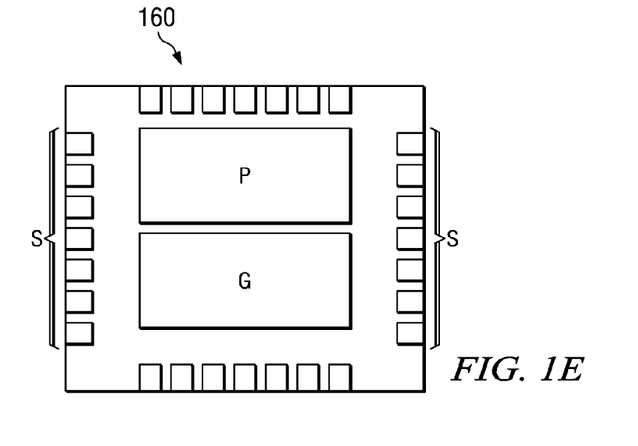

FIGS. 1D and 1E each show split die pad leadframe designs 150 and 160 according to embodiments of the invention that can be used with TSV comprising ICs according to embodiments of the invention to form packaged electronic devices. The P and G pads shown are large pads as compared to the periphery signal pads shown as "S" in FIGS. 1D and 1E to provide improved thermal dissipation. The P and G pads shown can be coupled to a plurality of TSVs.

Figure 2:
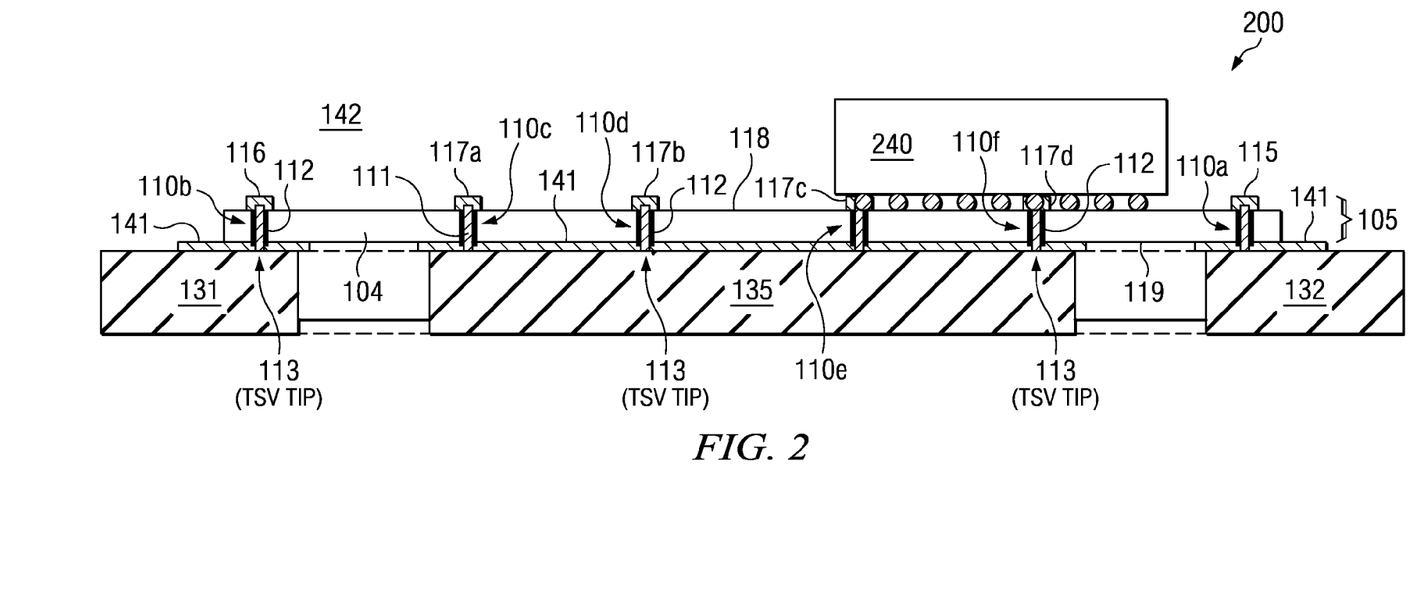
FIG. 2 is cross sectional depiction of a packaged electronic device according to an embodiment of the invention viewed along the center of the package including TSVs connecting pads on the top surface of a first IC die to lead pins of the package for I/O connections and to the die pad for ground connections, with a stacked second IC die or other electronic component mounted face-face to the first IC die.

FIG. 2 is cross sectional depiction of a packaged electronic device 200 according to an embodiment of the invention viewed along the center of the package including TSVs 110 connecting pads on the top surface of a first (prime) IC die 105 shown in FIG. 1A to lead pins of the package 131 and 132 for I/O and P connections and to the die pad 135 for ground connections, with a stacked second IC die or other electronic component 240 mounted face-face to the first IC die 105.

Figure 3:
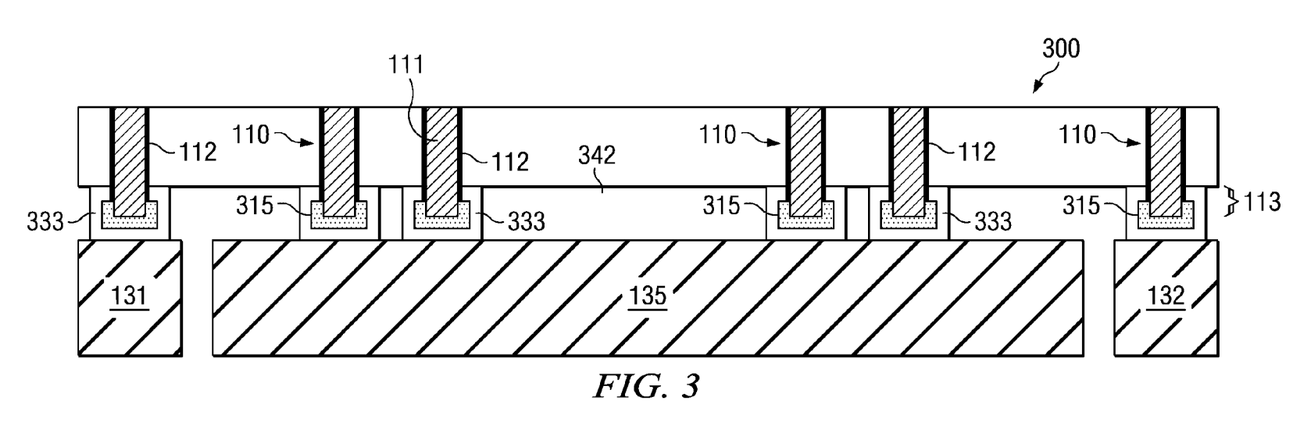
FIG. 3 shows a cross sectional depiction of the resulting electronic device structure formed by making interconnections between metal capped protruding integral TSV tips that are soldered to the die pad of a lead frame of a package, according to an embodiment of the invention.

FIG. 3 shows a cross sectional depiction of the resulting electronic device structure formed by making interconnections between metal capped protruding integral TSV tips that are soldered to the die pad of a lead frame of a package, according to an embodiment of the invention. A dielectric underfill adhesive 342 fills in the gap region. Metal caps are shown as 315. In this embodiment, interconnection is made by electrically conductive caps 315, such as a Cu/solder or solder alloy or Ni/solder or solder alloy cap on the ends of the TSV tips 113 that can be soldered to the die pad 135 and pins 131 and 132 by solder 333, followed by forming a non-electrically conductive underfill adhesive 342 in the gap region lateral to the TSV tips 113. Exemplary processing options for applying solder to the TSV tips 113 include direct electroless or Immersion Sn plating, plating using photoresist, a Showa Denko Super Juffit application process, or a Senju PPS-Powder Prepreg sheet process. These processes can be performed with the TSV comprising wafer while on a suitable carrier.

In one embodiment, soldering comprises a reflow process to attach the IC die, followed by a capillary underfill for forming the dielectric underfill layer between the bottom surface of the IC die and the lead frame in the gap region lateral to the TSV tips. In another embodiment, the method further comprises dispensing a laminate underfill film on the bottom surface of the IC die and the soldering comprises a simultaneous reflow/cure process. In yet another embodiment, the method further comprises dispensing a no-flow underfill film onto the die pad, wherein the soldering comprises a simultaneous reflow/cure process.

Figure 4:
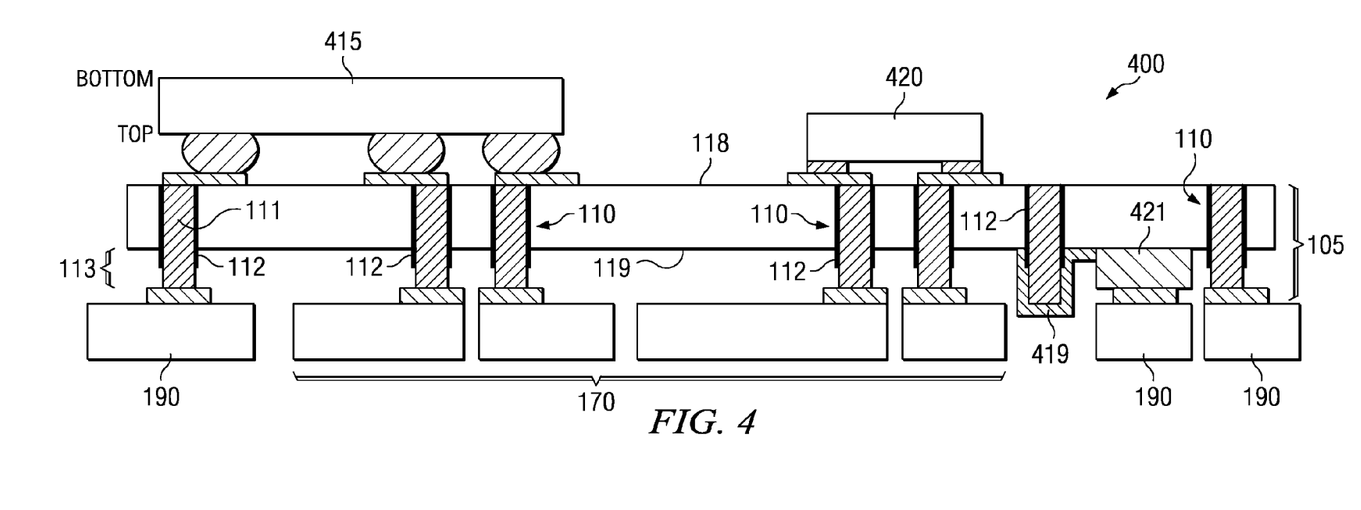
FIG. 4 is a cross sectional depiction of a die stacked electronic device viewed along the center of the package including the TSV comprising IC die shown in FIG. 1A with an added metal RDL on its bottom surface mounted to a leadframe based on the leadframe shown in FIG. 1C including a split die pad for P and G, according to an embodiment of the invention.

FIG. 4 is a cross sectional depiction of a die stacked electronic device 400 according to an embodiment of the invention viewed along the center of the package including IC die 105 shown in FIG. 1A comprising TSVs 110 having protruding integral tips 113 connecting pads on the top surface 118 of IC die 105 that has a metal RDL on its bottom surface 119 to a leadframe similar to leadframe 180 shown in FIG. 1C including split die pad 170 for P and G connections and periphery lead pins 190 for I/O connections. The stacked die shown comprise active IC 415 which is shown flip chip attached to IC die 105. Passives (L, R, C) 420 are shown stacked on prime IC die 105 and positioned lateral with respect to IC 415. IC die 105 includes an RDL 419 on its bottom surface 119. Although not shown in FIG. 4, additional actives can be provided to make a multi-chip module or SiP, or a stack of die (e.g. in the case of memory IC).

The RDL 419 is generally built with a BEOL wafer level process prior to assembly. The RDL 419 can connect any of the TSVs 110 and provide lateral traces to metal pads 421 on the bottom 119 of IC die 105, wherein the metal pads 421 are positioned at locations that are aligned with the leadframe pins for boding thereto to avoid the co-design requirement for aligning the TSVs with these locations. This embodiment can provide a more flexible IC die design.

Various assembly options can be used with embodiments of the invention. In one embodiment, a reflow process is used to attach the IC die to the leadframe, followed by use of capillary underfill. In another embodiment, a laminate underfill film is applied onto the IC die and bonding the IC die to the leadframe can comprise a simultaneous reflow/cure process. In yet another embodiment, a no-flow underfill is dispensed onto die pad, and the IC die is bonded to the lead frame using a simultaneous reflow/cure process.

Below an exemplary process sequence is described for forming IC die having dielectric lined TSVs having integral TSV tips that protrude from the bottom side of the die having a dielectric tip liner along a portion of the tip height. Other processes sequences may also be used with embodiments of the invention.

Embedded via-first TSVs are conventionally formed by topside via etching (e.g. by RIE) to a depth less than the thickness of the substrate/wafer, framing the via by forming a dielectric liner in the via, followed by filling the via with an electrically conductive filler material. A barrier metal layer (e.g., Ta or TaN) is also generally included and in some embodiments a seed layer (e.g., for copper) is generally also included. The wafer is then generally background to expose the tip of the embedded TSV. In contrast, the process described below is an exemplary multi-step chemical etch process which is exclusive of mechanical etching that processes wafers having embedded via-first TSVs to form protruding integral TSV tips that avoids contact of the TSV tips with the grinding tool. The multi-step chemical etch process described herein completes the substrate thinning process began by backgrinding and then typically chemical mechanical polishing (CMP), by gently (i.e. non-mechanically) removing a protective substrate layer that is between the bottom of the embedded via-first TSV tip and the bottom side of the substrate that remains following the mechanical removing process(es) to form protruding integral TSV tips.

Avoiding direct physical contact of the TSV tip with the backgrind tool has been found by the Present Inventors to avoid, or at least significantly reduce, mechanical damage to the electrically conductive filler material, diffusion barrier metal (if present) and dielectric liner surrounding the TSV, as well as reduce or eliminate smearing of the electrically conductive filler material (e.g., metal) on the bottom substrate surface. As defined herein, a "chemical etch" refers to a wet or dry (e.g., plasma) etch that is exclusive of mechanical etching. A "chemical etch exclusive of mechanical etching" as used herein can include CMP provided the CMP process is configured to function as a chemical etch by providing a selectivity between the material of the wafer (e.g., silicon) and the dielectric liner of >10:1, and thus have at most a minimal mechanical component. For example, a CMP process having no abrasive particles (e.g. no particles having a Mohs hardness≧the Mohs hardness of silica) can in certain arrangements provide a minimal mechanical component.

A first backside etch can be used to etch the bottom surface of the wafer with selectivity with respect to the liner to form an protruding integral TSV tip having an initial tip height $H_{initial}$. The etch selectivity for the first backside etch is generally high enough to avoid removing the dielectric liner to expose the electrically conductive filler material of the protruding integral TSV tip. The first backside etch generally has a selectivity between the material of the wafer (e.g., silicon) and the dielectric liner of >10:1, and is typically 100:1 to 1,000:1 or more. A selectivity lower than about 10 will generally cause excessive loss of the dielectric liner.

The first backside etch process can comprise a variety of wet etch options including quaternary ammonium hydroxides such as $((CH_3)_4NOH)$; tetramethyl ammonium hydroxide) commonly referred to as TMAH, KOH, choline, mixtures of acids such as HF, nitric, sulphuric, and phosphoric. Alternatively, a dry etch process, such as a fluorine containing plasma etch, can also generally be used. As another alternative, CMP can be used if it is configured to provide provided a selectivity between the material of the wafer (e.g., silicon) and the dielectric liner of >10:1.

The range of the thickness of the wafer that is removed by the first backside etch is generally <6% within a wafer with average variation of <5% from wafer to wafer. The total substrate amount etched in the first backside etch is generally from 5 to 50 µm.

A second backside etch is for removing the dielectric liner from at least the distal end of the protruding integral TSV tip. This process can comprise a wet etch process such as HF or dilute HF, or a fluorine-based plasma etch. The dielectric liner may become recessed from the bottom surface of substrate to form a dielectric liner recess on the periphery of the protruding integral TSV tip because the dielectric liner is generally removed at a significantly higher etch rate as compared to the etch rate of the backside surface of the wafer (e.g., silicon). However, the second backside etch process may be selected to etch the bottom surface of the substrate at a rate relative to that of dielectric liner that is high enough to avoid or at least limit formation of such dielectric recesses.

The second backside etch should generally have a selectivity between etching the dielectric liner and electrically conductive filler material of >2:1, typically being >10:1.

Lower selectivity below about 2:1 can cause excessive loss of the electrically conductive filler material.

The range of the thickness of the dielectric liner that is removed by the second backside etch should generally be <10% within a wafer with average variation of <10% from wafer to wafer. The total etch amount for dielectric liner is generally from 0.2 to 10 µm.

The second backside etch can also be a sequence of two or more etch conditions to remove the full thickness of the dielectric liner to expose the surface of the electrically conductive filler material for protruding integral TSV tip. The exposed surface of the electrically conductive filler material should generally be free of significant corrosion (i.e. oxide). As noted above, the second backside etch can also be selected to remove the barrier metal layer if present on the surface of the electrically conductive filler material for protruding integral TSV tip.

A third backside etch is for removing substrate material (e.g., silicon) from the bottom surface of substrate to achieve the desired TSV tip height. As described above, the tip height can generally range from 1 µm to 50 µm, and is typically selected depending on the standoff distance for the particular package design and joint used to bond to the TSVs to a workpiece. The third backside etch process has a selectivity to the electrically conductive filler material and generally also a selectivity to the dielectric liner. The resulting height of the dielectric liner on the integral TSV tip referred to herein as the dielectric tip liner has a height $h_{dielectric}$. $h_{dielectric}$ generally ranges from 0.1 µm to 50 µm and typically ranges from 10 to 90% of the tip height, such as 3 µm to the tip height minus 3 µm. The protruding integral TSV tip can include an exposed tip portion that comprises exposed electrically conductive filler material on the end of protruding integral TSV tip. Exposed tip portion thus extends beyond dielectric tip liner.

Analogous the first backside etch, the third backside etch process generally has a selectivity between the material of the wafer (e.g., silicon) and the dielectric liner of >10:1, and is typically 100:1 to 1,000:1 or more, and can comprise a wet etch with various options including TMAH, KOH, choline, mixtures of acids such as HF, nitric, sulphuric, and phosphoric. Alternatively, a dry etch process, such as a fluorine containing plasma etch, can generally be used. As another alternative, CMP can be used if it is configured to provide a selectivity between the material of the wafer (e.g., silicon) and the dielectric liner of >10:1.

The third backside etch generally provides a selectivity between substrate (e.g., silicon) etching and the electrically conductive filler material of the TSV of >2:1, with a typical selectivity of >10:1. Lower selectivity can cause excessive loss of the electrically conductive filler material.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

I claim:

1. A packaged electronic device, comprising:
    a package comprising a leadframe and a first integrated circuit (IC) die;
    said leadframe including a die pad and a plurality of lead pins including a first, second, and a third lead pin surrounding said die pad;
    the first integrated circuit (IC) die assembled in a face-up configuration on said lead frame, said IC die including:
        a substrate having an active top semiconductor surface and a bottom surface, said top semiconductor surface including integrated circuitry having an input pad, an output pad, a power supply pad, and a ground pad;
        a plurality of through-substrate vias (TSVs) having an electrically conductive filler material extending from said top semiconductor surface through said substrate, including:
            a first TSV coupling said input pad to said first lead pin, a second TSV coupling said output pad to said second lead pin, a third TSV coupling said power supply pad to said third lead pin or a first portion of said die pad, said first TSV, said second TSV and said third TSV including a dielectric liner surrounding said electrically conductive filler material; and
            a fourth TSV coupling said ground pad to said die pad or a second portion of said die pad.

2. The packaged electronic device of claim 1, wherein said plurality of TSVs comprise a protruding integral tip from the bottom surface comprising said electrically conductive filler material, wherein a tip height of said protruding integral tip is between 1 and 50 µm.

3. The packaged electronic device of claim 2, wherein said dielectric liner extends onto sidewalls of said protruding integral of said plurality of TSVs a distance of at least 1% of said tip height.

4. The packaged electronic device of claim 1, wherein said fourth TSV comprises a first plurality of said plurality of TSVs.

5. The packaged electronic device of claim 1, wherein said first IC die extends at least partially over said plurality of lead pins, said first TSV being aligned to said first lead pin, said second TSV aligned to said second lead pin, said third TSV aligned to said third lead pin, and said fourth TSV aligned to said die pad.

6. The packaged electronic device of claim 5, further comprising an electrically conductive die attach material between said bottom surface of said first IC die and said die pad, and said bottom surface of said first IC die and said first, second, third and fourth lead pins.

7. The packaged electronic device of claim 5, wherein said bottom surface of said first IC die is in direct thermal contact with said die pad, and said die pad has a bottom portion that is exposed by said package.

8. The packaged electronic device of claim 1, wherein said die pad comprises a split die pad that provides said first portion and said second portion of said die pad electrically isolated from one another, wherein said third TSV couples said power supply pad to said first portion of said die pad, and said fourth TSV couples said ground pad to said second portion of said die pad.

9. The packaged electronic device of claim 7, wherein said package comprises a leadless package.

10. The packaged electronic device of claim 9, wherein said leadless package comprises a quad flat no lead (QFN) package.

11. The packaged electronic device of claim 1,
wherein said plurality of TSVs each comprise an protruding integral tip from the bottom surface comprising said electrically conductive filler material and wherein a tip height of said protruding integral tip is between 1 and 50 µm, said protruding integral tip portion comprising a solder comprising capping layer bonded to a distal end of said plurality of protruding integral tip,
further comprising a dielectric die attach material between said first IC die and said die pad and said first IC die and at least a majority of said plurality of lead pins.

12. The packaged semiconductor device of claim 11, wherein said first IC die includes a metal comprising redistribution layer (RDL) positioned on said bottom surface of said first IC die comprising at least one bond pad and at least one metal trace for coupling at least one of said plurality of TSVs to said bond pad, said bond pad contacting at least one of said plurality of lead pins.

13. The packaged semiconductor device of claim 11, wherein said plurality of TSVs are aligned on said IC die to be positioned directly over said plurality of lead pins.

14. The packaged electronic device of claim 11, further comprising a second IC die in a flip chip configuration mounted on top of said first IC die.

* * * * *